(12) United States Patent
Park

(10) Patent No.: US 9,466,632 B2
(45) Date of Patent: Oct. 11, 2016

(54) IMAGE SENSOR PACKAGE AND AN IMAGE SENSOR MODULE HAVING THE SAME

(71) Applicant: Samsung Electronics Co., Ltd., Suwon-Si, Gyeonggi-Do (KR)

(72) Inventor: Ok-Gyeong Park, Yeongdeok-gun (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 14/593,500

(22) Filed: Jan. 9, 2015

(65) Prior Publication Data

US 2016/0204155 A1    Jul. 14, 2016

(51) Int. Cl.
*H01L 27/14* (2006.01)
*H01L 27/146* (2006.01)

(52) U.S. Cl.
CPC ... *H01L 27/14636* (2013.01); *H01L 27/14618* (2013.01); *H01L 27/14627* (2013.01)

(58) Field of Classification Search
CPC .................. H01L 27/14636; H01L 27/14627; H01L 27/14618
See application file for complete search history.

(56) References Cited

U.S. PATENT DOCUMENTS

| | | | |
|---|---|---|---|
| 7,550,825 B2 | 6/2009 | Santos et al. | |
| 7,880,276 B2 | 2/2011 | Nishimura et al. | |
| 2007/0183773 A1* | 8/2007 | Aoki | G03B 17/02 396/529 |
| 2008/0122967 A1* | 5/2008 | Huang | G02B 7/08 348/340 |
| 2009/0095975 A1 | 4/2009 | Shin et al. | |
| 2013/0026655 A1 | 1/2013 | Lee et al. | |
| 2015/0301266 A1* | 10/2015 | Araki | G02B 6/005 349/65 |

FOREIGN PATENT DOCUMENTS

| | | |
|---|---|---|
| JP | 08116007 | 5/1996 |
| JP | 09283544 | 10/1997 |
| JP | 2000340934 A | 12/2000 |
| JP | 2007096042 A | 4/2007 |
| JP | 4620939 B2 | 1/2011 |
| JP | 4904767 B2 | 3/2012 |
| JP | 2012049355 A | 3/2012 |
| JP | 4994173 B2 | 8/2012 |
| JP | 2012146836 A | 8/2012 |
| KR | 20060017294 A | 2/2006 |
| KR | 20080065871 A | 7/2008 |
| KR | 1136719 | 11/2010 |

* cited by examiner

*Primary Examiner* — Roy Potter
*Assistant Examiner* — Paul Patton
(74) *Attorney, Agent, or Firm* — Harness, Dickey & Pierce, P.L.C.

(57) ABSTRACT

Disclosed are an image sensor package and an image sensor module having the same. A diffusion resistor is provided on a circuit board for preventing liquid drop diffusion when the liquid drop is compressed. An image sensor chip is mounted on the circuit board such that a central portion of the image sensor chip is positioned on the diffusion resistor of the circuit board. A bonding member is interposed between the circuit board and the image sensor chip around the diffusion resistor such that a bonding area of the image sensor chip is smaller than a surface area of a bonding face of the image sensor chip. Warpage characteristics of the image sensor package are improved by the diffusion resistor.

16 Claims, 3 Drawing Sheets

IMAGE SENSOR PACKAGE AND AN IMAGE SENSOR MODULE HAVING THE SAME

BACKGROUND

1. Field

Example embodiments relate to an image sensor chip package and an image sensor module having the same, and more particularly, to a CMOS image sensor (CIS) chip package having a complementary metal-oxide semiconductor (CMOS) image sensor chip and a CIS module having the CIS chip package.

2. Description of the Related Art

Recently, there has been a rapid rise in demand for digital imaging devices such as digital cameras and camera phones having high resolution image sensor modules. The image sensor module includes an image sensor chip for converting optical images to electrical signals.

Most of the image sensors are usually classified into a charge coupled device (CCD) type image sensor and a complementary metal-oxide semiconductor (CMOS) type image sensor. However, since the CMOS type image sensor may be manufactured based on the conventional manufacturing processes of the semiconductor devices, the CMOS image sensors are recently tend to be widely used in that the manufacturing cost can be reduced and the signal processing algorithms can be easily changed for improving the image quality rather than the CCD image sensor.

The conventional CMOS image sensor is provided as a CMOS image sensor package in which the CMOS image sensor chip is mounted onto a circuit board. Thus, the CMOS image sensor package is usually installed to a system board in such a way that a driving unit and a control unit of a digital imaging system can be electrically connected to the CMOS image sensor package. The CMOS image sensor chip, the driving unit and the control unit may be mounted on the same circuit board as an image sensor system package if needed.

The image quality of the CMOS image sensor can largely depend on the warpage characteristics of the CMOS image sensor package, so that the CMOS image sensor chip is required to bonded to the circuit board in a bonding area as small as possible under the condition of no damage to the boding force therebetween. For those reasons, the CMOS image sensor chip is usually bonded to the circuit board by using a die attach apparatus in such a way that the CMOS image sensor chip is bonded to a central portion of the circuit board for the minimal warpage.

However, the die attach apparatus for boding the CMOS image sensor chip to the circuit board has no analysis tools for analyzing the characteristics of adhesives such as a density, a weight and a viscosity and has no measurement tools for detecting the boding area and bonding position between the image sensor chip and the circuit board. As a result, the bonding area, the bonding position and the bonding force between the image sensor chip and the circuit board may be varied in each CMOS image sensor package, so it is difficult for the conventional CMOS image sensor package to have uniform warpage characteristics, and thus the image quality of the CMOS image sensor packages cannot be uniform or stable although the CMOS image sensor packages are manufactured in the same process.

SUMMARY

Example embodiments of the present inventive concepts provide an image sensor package in which an image sensor chip may be bonded to a central portion of a circuit board in a uniform bonding area.

Example embodiments of the present inventive concepts provide an image sensor module having the above image sensor package.

Example embodiments of the present inventive concepts provide a CMOS image sensor package in which a bonding position, a bonding area and a bonding force between the CMOS image sensor chips and their circuit boards may be uniform and/or stable, irrespective of an individual CMOS image sensor package.

According to an aspect of the present inventive concepts, there is provided an image sensor package including a circuit board having a diffusion resistor for preventing liquid drop diffusion due to a compression to a liquid drop, an image sensor chip mounted on the circuit board such that a central portion of the image sensor chip is positioned on the diffusion resistor of the circuit board, and a bonding member interposed between the circuit board and the image sensor chip around the diffusion resistor such that a bonding area of the image sensor chip is smaller than a surface area of a bonding face of the image sensor chip.

In at least one example embodiment, the diffusion resistor may include a protrusion portion protruding from a front surface of the circuit board to a protrusion height in such a configuration that the bonding member may cover top and side portions of the protrusion portion.

In at least one example embodiment, the image sensor package may further include an anti-deflection member filling a gap space between the circuit board and a peripheral portion of the image sensor chip, to thereby prevent a deflection of the image sensor chip toward the circuit board.

In at least one example embodiment, the diffusion resistor may include a recess recessed from a front surface of the circuit board to a recess depth in such a configuration that the bonding member may be positioned in the recess and on the front surface around the recess.

In at least one example embodiment, the diffusion resistor may include an isolated portion defined by a trench on the front surface of the circuit board in such a configuration that the bonding member is positioned on the isolated portion and in the trench of the circuit board.

In at least one example embodiment, the bonding member may include one of epoxy resin, acryl resin, polyimide resin and silicone resin.

In at least one example embodiment, the image sensor package may further include at least one bonding wire connecting the image sensor chip and the circuit board.

In at least one example embodiment, the image sensor chip may include an active pixel sensor (APS) for generating signal electrons in response to external optical signals, a logic unit connected to the APS and processing of the APS corresponding to the signal electrons and a shield layer covering the logic unit and shielding electromagnetic waves.

In at least one example embodiment, the APS and the logic unit may include a plurality of complementary metal-oxide semiconductor (CMOS) devices.

In at least one example embodiment, the circuit board may include one of an organic substrate, a silicon substrate, a ceramic substrate and a glass-reinforced epoxy substrate.

In at least one example embodiment, the bonding area may be 50% to 70% of the surface area of the bonding face of the image sensor chip.

According to another aspect of the present inventive concepts, there is provided an image sensor module including an image sensor package including a circuit board having a diffusion resistor for preventing liquid drop diffusion due to a compression to a liquid drop, an image sensor chip mounted on the circuit board in such a configuration that a central portion of the image sensor chip may be positioned on the diffusion resistor of the circuit board and generating image signals from optical signals, and a bonding member interposed between the circuit board and the image sensor chip around the diffusion resistor in such a configuration that a bonding area of the image sensor chip may be smaller than a surface area of a bonding face of the image sensor chip; a housing installed on the circuit board to cover the image sensor chip and having an opening through the image sensor chip may be partially exposed; and a lens unit guiding the optical signals to the image sensor chip through the opening.

In at least one example embodiment, the bonding area may be 50% to 70% of the surface area of the bonding face of the image sensor chip.

In at least one example embodiment, the diffusion resistor may include one of a protrusion portion protruding from a front surface of the circuit board to a protrusion height, a recess recessed from a front surface of the circuit board to a recess depth and an isolated portion defined by a trench on the front surface of the circuit board.

In at least one example embodiment, the image sensor chip may include a CMOS image sensor chip having at least one complementary metal-oxide semiconductor (CMOS) device.

According to example embodiments of the present inventive concepts, the liquid diffusion of the bonding member may be restrained and limited between the image sensor chip and the circuit board by the diffusion resistor, so the bonding area and the bonding position of the image sensor may be uniform irrespective of individual bonding process. Thus, the image sensor chip may be stably and uniformly bonded to the circuit board irrespective of each bonding process and the warpage characteristics of the image sensor package may be improved due to the diffusion resistor on the circuit board. Particularly, since the bonding area and the bonding position of the image sensor chip with respect to the circuit board may have much effect on the warpage characteristics of the image sensor package, the bonding characteristics of the present image sensor package may greatly improve the warpage characteristics of the image sensor package. As a result, the operational stability and reliability may be improved in the electronic system including the image sensor module.

Particularly, when the image sensor chip may move towards the circuit board for a bonding process, the image sensor chip may be arranged over the circuit board by using the diffusion resistor as a reference point in such way the central portion C of the image sensor chip face the diffusion resistor. Thus, the central portion of the image sensor chip may be bonded to the diffusion resistor of the circuit board, so that the bonding force between the image sensor chip and the circuit board may be symmetrical with respect to the central portion and may be uniform along a whole circuit board, thereby reducing or minimizing the warpage of the image sensor package.

BRIEF DESCRIPTION OF THE DRAWINGS

These and other features of the inventive concepts will become more apparent by describing in detail example embodiments thereof with reference to the accompanying drawings of which.

DETAILED DESCRIPTION OF EXAMPLE EMBODIMENTS

Figure 1:
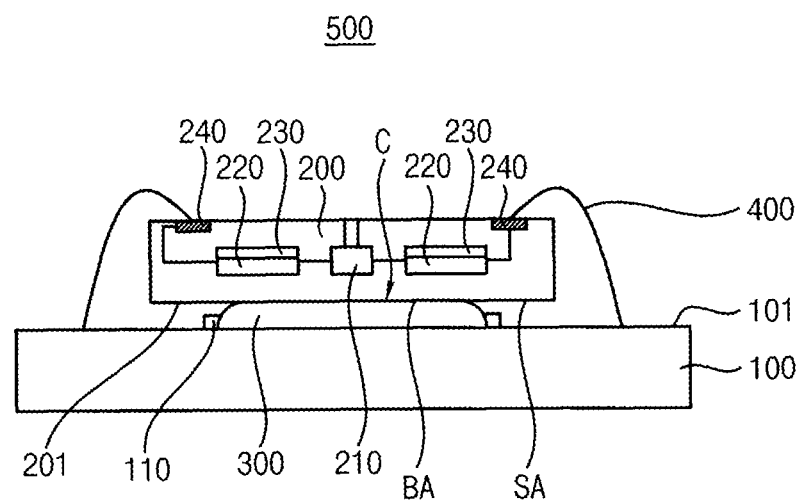
FIG. 1 is a cross-sectional view illustrating an image sensor package in accordance with an example embodiment of the present inventive concepts.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

CMOS Image Sensor (CIS) Package

FIG. 1 is a cross-sectional view illustrating an image sensor package in accordance with an example embodiment of the present inventive concepts.

Referring to FIG. 1, the chip stack package 1000 in accordance with an example embodiment of the present inventive concepts may include a circuit board 100 having a diffusion resistor 110 for preventing liquid drop diffusion due to a compression to a liquid drop, an image sensor chip 200 mounted on the circuit board 100 such that a central portion C of the image sensor chip 200 is positioned on the diffusion resistor 110 of the circuit board 100, and a bonding member 300 interposed between the circuit board 100 and the image sensor chip 200 around the diffusion resistor 110 such that a bonding area BA of the image sensor chip 200 is smaller than a surface area SA of a bonding face 201 of the image sensor chip 200.

In at least one example embodiment, the circuit board 100 may include a circuit pattern (not shown) therein, so that the image sensor chip 200 and external devices (not shown) may be electrically connected with the circuit pattern. For example, the circuit board may be provided on an organic substrate, a silicon substrate, a ceramic substrate and a glass-reinforced epoxy resin substrate. In the present example, the circuit board may include a printed circuit board (PCB) in which a plurality of circuit patterns may be formed on upper and lower surfaces of the glass-reinforced epoxy resin substrate in a multilayer structure.

The diffusion resistor 110 may be arranged on the circuit board 100, to thereby prevent liquid drop diffusion due to a compression to a liquid drop. Therefore, when the bonding member 300, which may be provided as liquid adhesive droplets, may be compressed on the circuit board by the image sensor chip 200, the diffusion resistor 110 may restrain the liquid drop diffusion of the adhesive droplets and thus may prevent the adhesive droplets from horizontal spread on a front surface 101 of the circuit board 100. Accordingly, the bonding area BA of the image sensor chip 200 may be controlled to be smaller than the surface area SA of the image sensor chip 200.

Particularly, the liquid bonding member 300 such as the adhesive droplets may be controlled to spread within a defined diffusion area on the front surface 101 of the circuit board 100 by the diffusion resistor 110, so that the bonding area BA of the image sensor chip 200 may be controlled to be uniform around the central portion of the image sensor chip 200 in each bonding process of the circuit board 100 and the image sensor chip 200. Therefore, the warpage characteristics of the image sensor package 500 may be improved due to the bonding area BA smaller than the surface area SA of the image sensor chip 200.

The image sensor chip 200 may convert external optical signals into image signals. For example, the image sensor chip 200 may include an active pixel sensor (APS) 210 for generating signal electrons in response to the external optical signals, a logic unit 220 connected to the APS 210 and processing output signals transferred from the APS 210 corresponding to the signal electrons and a shield layer 230 covering the logic unit 220 and shielding electromagnetic waves.

The APS 210 may include a plurality of pixels and each of the pixels may include a photoelectric converter such as a photodiode for converting the external optical signals into the signal electrons and a plurality of transistors for processing the signal electrons. For example, the signal electrons may be amplified or selectively passed or not by the transistors. The logic unit 220 may include a driving circuit for driving the pixel, an analog-to-digital converter (ADC) for converting the signal electrons to digital signals and an image sensor processor (ISP) for generating image signals in response to the digital signals. The shield layer 230 may cover the logic unit 220 except the ASP 210 and may prevent the logic unit 220 from being damaged by the electromagnetic waves. A contact pad 240 may be arranged at a peripheral portion of the image sensor chip 200 and may be connected with the logic unit 220. The contact pad 240 may be electrically connected to the circuit board 100 via a bonding wire 400, so that the logic unit 220 may be electrically connected to the circuit pattern of the circuit board 100 via the bonding wire 400.

In at least one example embodiment, the ASP 210 and the logic unit 220 may include a plurality of complementary metal-oxide semiconductor (CMOS) devices, so that the image sensor chip 200 may include a CMOS image sensor chip. However, the image sensor chip 200 may also include a charge-coupled device (CCD) having a relatively high storage capacity and high power consumption.

Particularly, the image sensor chip 200 may be positioned on the circuit board 100 in such a way that a central portion C of the image sensor chip 200 may be arranged on the diffusion resistor 110, so that the image sensor chip 200 may be symmetrically arranged on the circuit board 100 with respect to the diffusion resistor 110.

For example, when the image sensor chip 200 may be transferred over the circuit board 100 by a die attach system, the position of the diffusion resistor 110 may function as a reference point of the movement of the image sensor chip 200. That is, the image sensor chip 200 may be arranged in such a way that the central portion C of the image sensor chip 200 may face the diffusion resistor 110. As a result, the image sensor chip 200 may be mounted onto the circuit board 100 in such a way that the central portion C of the chip 200 may make contact with the diffusion resistor 110.

When the image sensor chip 200 may be bonded to the circuit board 100 and the bonding member 300 may be compressed between the image sensor chip 200 and the circuit board 100, the bonding member 300 may be diffused on the circuit board 100 under the restriction or limitations of the diffusion resistor 110. That is, the bonding member 300 may be prevented from being diffused along random directions on the circuit board 100 and thus the bonding area BA of the image sensor chip 200 may be limited within the diffusion area limited by the diffusion resistor 110. The bonding member 300 may be controlled to be symmetrically diffused on the circuit board 100 with respect to the diffusion resistor 110, so that the barycenter of the image sensor chip 200 may be close to that of the bonding member 300 and the barycenter deviation between the image sensor chip 200 and the bonding member 300 may be reduced or, which may reduce or the warpage of the image sensor package 500.

The bonding member 300 may include an adhesive having a liquefied die attach materials that may be supplied onto the diffusion resistor 110 as liquid droplets. For example, the liquefied adhesive may be supplied onto the diffusion resistor 100 through a dispensing tool having a nozzle for injecting a liquid. Thus, the bonding member 300 may be supplied on the diffusion resistor 110 as the liquid droplets.

For example, the bonding member 300 may include epoxy resin, acryl resin, polyimide resin, silicone resin, etc. These may be used alone or in combinations thereof. In contrast, the bonding member 300 may include a solder bump having good electrical conductivity. Various adhesives may be used as the bonding member 300 as long as the adhesive may be supplied through the dispensing tool as the liquid droplets and may have a sufficient bonding force between the image sensor chip 200 and the circuit board 100.

When the bonding member 300 may be supplied onto the diffusion resistor 110 of the circuit board 100 and the image sensor chip 200 may be arranged over the circuit board 100 in such a way that the central portion C of the image sensor chip 200 may face the diffusion resistor 110, the image sensor chip 200 may move downwards and make contact with the circuit board 100 and may be bonded to the circuit board 100. In such a case, the bonding member 300 may be diffused or spread on the diffusion resistor 110 by a thermal compression process. That is, the bonding member 300 may be diffused on and around the diffusion resistor 110 between the image sensor chip 200 and the circuit board 100.

Particularly, the liquid drop of the bonding member 300 may be diffused in a diffusion area which may be controlled and defined by the diffusion resistor 110 and the image sensor chip 200 may be covered with the bonding member as large as the diffusion area, so that the bonding area BA of the image sensor chip 200 may be substantially uniform and stable in view of size and shape. That is, the bonding member 300 may make contact with the bonding area BA of the image sensor chip 200 irrespective of the individual bonding process for bonding the image sensor chip 200 to the circuit board 100. In a conventional bonding process, the bonding member is diffused and spread in random directions on the circuit board, so that the bonding area of the image sensor chip may have individual size and shape. However, the boning area BA of the image sensor chip 200 may have uniform size and shape irrespective of the individual bonding process due to the diffusion resistor 110. That is, the image sensor chip 200 may be bonded to the circuit board 100 across the uniform bonding area BA.

In at least one example embodiment, the diffusion resistor 110 may be configured in such a structure that the bonding area BA may be about 50% to about 70% of the surface area SA of the bonding face 201 of the image sensor chip 200. The bonding face 201 may face the front surface 101 of the circuit board 100 when the image sensor chip 200 may be bonded to the circuit board 100. In at least one example embodiment, the image sensor chip 200 may be mounted on the circuit board 100 such that the active face may face upwards, so the bonding face 201 may include a rear face of the image sensor chip 200. However, when the image sensor chip 200 may be mounted on the circuit board 100 in a flip chip structure, the bonding face would include the active face of the image sensor chip. Accordingly, the bonding area BA of the image sensor chip 200 may be controlled to be uniform irrespective of the individual bonding process just by a modification of the circuit board 100 like the diffusion resistor 110 without any other modifications of the bonding member 300.

In at least one example embodiment, the central portion C of the image sensor chip 200 may be bonded to the diffusion resistor 110, so the bonding area BA may be symmetrically arranged with respect to the central portion C of the image sensor chip 200. As a result, the warpage of the image sensor package 500 may be improved due to the symmetrical bonding of the image sensor chip 200 to the circuit board 100.

The bonding wire 400 may be connected with the contact pad 240 of the image sensor chip 200 and a bonding pad (not shown) of the circuit board 100, thus the image signals may be transferred to the circuit pattern (not shown) of the circuit board 100 from the image sensor chip 200. Various external devices such as a memory device for storing images, a driving signal generator and a timing signal processor may also be connected to the circuit board 100, and as a result, to the image sensor chip 200, so the image signals generated from the image sensor chip 200 may be processed into the image data and the image data may be stored in the memory device or may be displayed on a displayer that may be connected to the image sensor package 500.

The image signals generated from the image sensor chip 200 may be transferred to the circuit pattern of the circuit board 100 via the bonding wire 400 and various control signals may be applied to the image sensor chip 200 via the bonding wire 400.

Particularly, when the image sensor chip 200 may be boned to the circuit board 100 in a flip chip structure, a plurality of conductive soldering structures may be interposed between the image sensor chip 200 and the circuit board 100 in place of the bonding wire 400. In such a case, the conducive soldering structures may replace the bonding member 300

Various modifications may be allowable to the diffusion resistor 110 as long as the drop diffusion of the liquid bonding member may be sufficiently controlled by the diffusion resistor 110. For example, a defining film for defining the diffusion area of the liquid drop of the bonding member 300 may be provided on the circuit board 100. In such a case, the liquid drops of the bonding member 300 may be supplied just in the area defined by the defining film and thus the diffusion area of the liquid drops may be limited within the diffusion area of the defining film.

Hereinafter, various modifications of the diffusion resistor 110 may be described in detail with reference to FIGS. 2 to 4.

Figure 2:
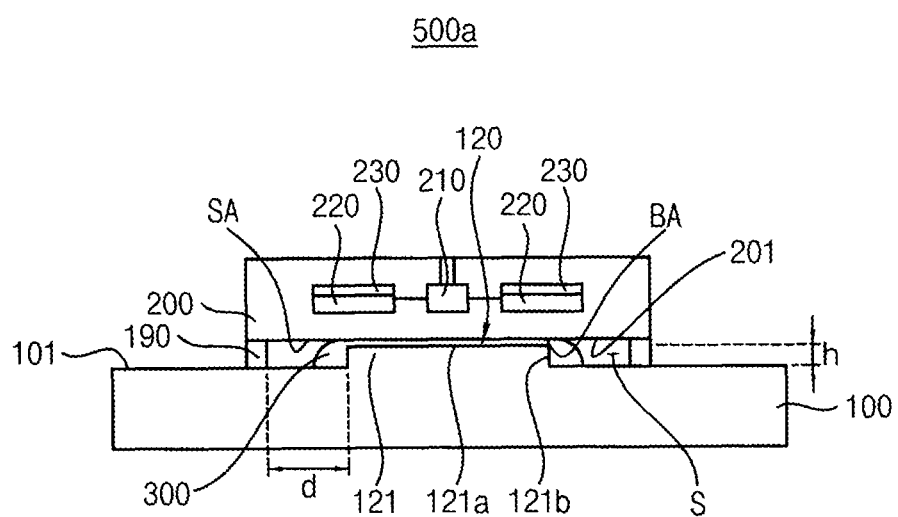
FIG. 2 is a cross-sectional view illustrating another image sensor package having a first modification of the diffusion resistor in accordance with an example embodiment of the present inventive concepts.
Figure 3:
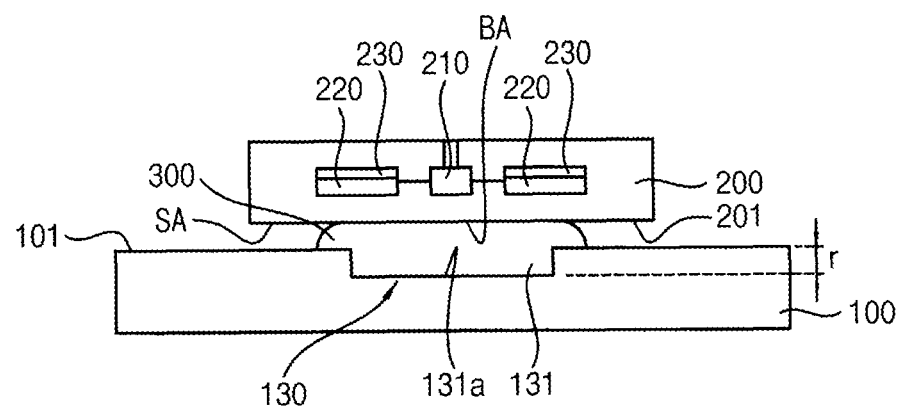
FIG. 3 is a cross-sectional view illustrating still another image sensor package having a second modification of the diffusion resistor in accordance with an example embodiment of the present inventive concepts.

FIG. 2 is a cross-sectional view illustrating another image sensor package having a first modification of the diffusion resistor in accordance with an example embodiment of the present inventive concepts, and FIG. 3 is a cross-sectional view illustrating still another image sensor package having a second modification of the diffusion resistor in accordance with an example embodiment of the present inventive concepts. In addition, FIG. 4 is a cross-sectional view illustrating further still another image sensor package having a third modification of the diffusion resistor in accordance with an example embodiment of the present inventive concepts In FIGS. 2 to 4, the modified image sensor chips may have substantially the same structure as the image sensor package shown in FIG. 1 except the diffusion resistor 110 of the circuit board 100. Thus, in FIGS. 2 to 4, the same reference numerals denote the same elements in FIG. 1 and detailed descriptions on the same elements will be omitted.

Referring to FIG. 2, another image sensor package 500a in accordance with an example embodiment of the present inventive concepts may include a first modified diffusion resistor 120. The first modified diffusion resistor 120 may include a protrusion 121 protruded from the front surface 101 of the circuit board 100 to a protrusion height h and the central portion C of the image sensor chip 200 may be bonded to the protrusion 121. As a result, the image sensor chip 200 may be spaced apart from the front surface 101 of the circuit board 100 in the image sensor package 500a.

The liquefied bonding member 300 may be supplied onto a top portion of the protrusion 121a and the image sensor chip 200 may be compressed to the protrusion 121 by the thermal compression process. Thus, the liquid droplets of the bonding member 300 may be diffused around the protrusion 121, and the bonding member 300 may be arranged on the top portion 121a and a side portion 121b of the protrusion 121 and on the front surface 101 around the protrusion 121. That is, the bonding member 300 may be positioned around the protrusion 121 in a gap space S between the image sensor chip 200 and the circuit board 100.

Due to the protrusion 121, the bonding member 300 may be diffused along the top and side portions 121a and 121b of the protrusion 121 and may not be diffused along the front surface 101 in the gap space S, thus the diffusion area of the bonding member 300 may be sufficiently limited around the protrusion 121. Accordingly, the image sensor chip 200 may be bonded to the circuit board 100 around the top portion 121a of the protrusion 121, and the bonding area BA of the image sensor chip 200 may be defined to an area around the top portion 121a of the protrusion 121 that may be sufficiently smaller than the surface area SA.

For example, the protrusion 121 may include the protrusion height h in a range of about 10 μm to about 200 μm from the front surface 101 of the circuit board 100. When the protrusion height h may be less than about 10 μm, the gap space S may be so small that the liquid droplets may be largely diffused or spread along the front surface 101 of the circuit board 100. In contrast, when the protrusion height h may be greater than about 200 μm, the bonding member 300 may be positioned just merely on the top portion 121a of the protrusion 121 and thus the bonding force of the bonding member 300 may be insufficient for bonding the image sensor chip 200 with the circuit board 100. For those reasons, the protrusion height h may be in a range of about 10 μm to about 200 μm, and more preferably, in a range of about 50 μm to about 100 μm, from the front surface 101 of the circuit board 100.

The protrusion 121 may be modified into various shapes as long as the bonding force of the bonding member 300 may be sufficient for bonding the image sensor chip 200 to the circuit board 100 and the gap space S may be sufficiently provided between the image sensor chip 200 and the circuit board 100. For example, the protrusion 121 may be shaped into a cylinder or a cube.

Since the image sensor chip 200 may be spaced apart from the circuit board 100 by the protrusion height h at a peripheral portion thereof, the image sensor chip 200 may tend to be deflected toward the circuit board 100 due to the bonding wire 400 that may connect the contact pad of the image sensor chip 200 and the bonding pad of the circuit board 100. For that reason, an anti-deflection member 190 may be interposed between the image sensor chip 200 and the circuit board 100 in such a configuration that the gap space S may be filled up with the anti-deflection member 190 at a peripheral portion of the image sensor chip 200, to thereby prevent a deflection of the image sensor chip 200 toward the circuit board 100.

For example, the anti-deflection member 190 may be shaped into a ring having a distance d from the protrusion 121 and enclosing the protrusion 121 and have a height greater than or equal to the protrusion height h. In at least one example embodiment, the anti-deflection member 190 may include a thermosetting resin having a sufficient strength.

The image sensor chip 200 may make contact with the bonding member 300 along the top portion 121a of the protrusion 121 and the circuit board 100 may make contact with the bonding member 300 along the side portion 121b of the protrusion 121 and along the front surface 101 of the front surface around the protrusion 121. Thus, the boding area of the image sensor chip 200 may be defined to the area of the top portion 121a of the protrusion 121. The first modified diffusion resistor 120 may be configured in such a structure that the top portion 121a may be in range of about 50% to about 70% of the surface area SA of the bonding surface 201 of the image sensor chip 200.

Referring to FIG. 3, still another image sensor package 500b in accordance with an example embodiment of the present inventive concepts may include a second modified diffusion resistor 130. The second modified diffusion resistor 130 may include a recess 131 recessed from a front surface 101 of the circuit board 100 to a recess depth r in such a configuration that the bonding member 300 may be positioned in the recess 131 and on the front surface 101 around the recess 131. The bonding member 300 may be supplied into the recess 131. In at least one example embodiment, the recess 131 may have a volume sufficient for holding about 90% to about 95% of the liquid droplet. For example, when the liquid droplet of the bonding member 300 may be shaped into a sphere, the recess depth r may be controlled to be equal to about 90% to about 95% of the diameter of the sphere.

As a result, about 5% to about 10% of the spherical droplet may be overflowed from the recess 131 and may be diffused along the front surface 101 of the circuit board 100 in performing the thermal compression process. Accordingly, the diffusion area of the liquid bonding member 300 may be limited to an area of the front surface 101 neighboring the recess 131, and the bonding area BA of the image sensor chip 200 may be controlled to be around the recess 131.

The image sensor chip 200 may make contact with the bonding member 300 on a first area corresponding to a bottom 131a of the recess 131 and on a second area corresponding to the front surface 101 around the recess 131. Thus, the boding area BA of the image sensor chip 200 may include the first area and the second area and the second modified diffusion resistor 130 may be configured into such a structure that the summation of the first and the second areas may be in range of about 50% to about 70% of the surface area SA of the bonding surface 201 of the image sensor chip 200.

Figure 4:
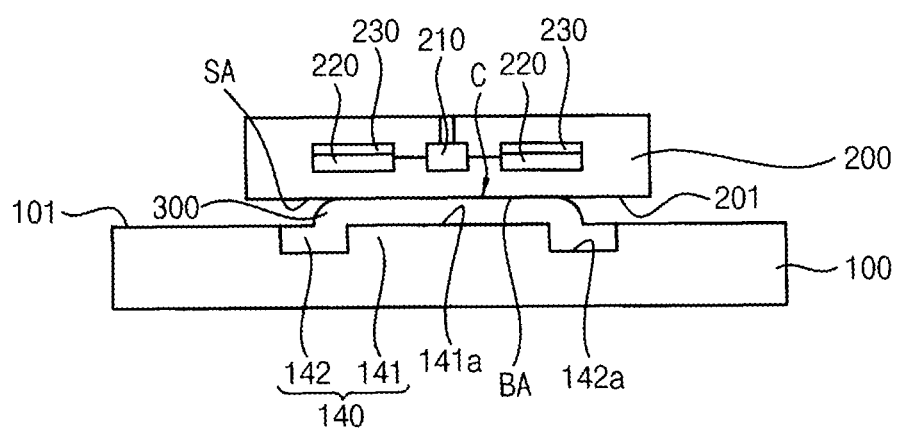
FIG. 4 is a cross-sectional view illustrating further still another image sensor package having a third modification of the diffusion resistor in accordance with an example embodiment of the present inventive concepts.

Referring to FIG. 4, further still another image sensor package 500c in accordance with an example embodiment of the present inventive concepts may include a third modified diffusion resistor 140. The third modified diffusion resistor 140 may include an isolated portion 141 defined by a trench 142 on the front surface 101 of the circuit board 100 in such a configuration that the bonding member 300 may be positioned on the isolated portion 141 and in the trench 142 of the circuit board 100. The central portion C of the image sensor chip 200 may be bonded to the isolated portion 141 and the bonding member 300 may be positioned on the isolated portion 141 and in the trench 142.

For example, the trench 142 shaped into a closed curve may be formed on the front surface 101 of the circuit board 100 and a portion of the front surface 101 enclosed and isolated by the loop-shaped trench 142 may be formed into the isolated portion 141. For example, the trench 142 may be shaped into a ring and the isolated portion 141 may be shaped into a circular island that may be isolated from other areas of the front surface 101 by the ring-shaped trench 142. Thus, the shape of the isolated portion 141 may be varied according to the shape of the trench 142 and the shape of the trench 142 may be varied according to the bonding requirements of the image sensor package 540c.

When a liquid droplet of the bonding member 300 may be compressed between the isolated portion 141 of the circuit board 100 and the image sensor chip 200, the liquid droplet may be diffused along the surface of the isolated portion 141 and then may be stacked in the trench 142 enclosing the isolated portion 141. Thus, the bonding member 300 may be prevented from being diffused along the front surface 101 of the circuit board 100 outside the trench 142. Accordingly, most of the bonding member 300 may be arranged on the isolated portion 141 and in the trench 142 and the diffusion area of the bonding member 300 may be defined by the isolated portion 141 and the trench 142 of the third modified diffusion resistor 140. Therefore, the bonding area BA of the image sensor chip 200 may be easily controlled by varying the sizes of isolated portion 141 and the trench 142.

The image sensor chip 200 may make contact with the bonding member 300 on a first area corresponding to a size of a top portion 141a of the isolated portion 141 and/or on a second area similar to a size of a bottom 142a of the trench 142, so that the boding area BA of the image sensor chip 200 may include the first area and the second area. When the bonding member 300 may be insufficiently supplied onto the isolated portion 141 and may not sufficiently fill up the trench 142, the bonding area BA of the image sensor chip 200 may be include just only the first area. In contrast, when the bonding member 300 may be excessively supplied onto the isolated portion 141 and may be overflowed from the trench 142, the bonding area BA of the image sensor chip 200 may be include a third area corresponding to the front surface 101 around the trench 142. In such a case, the bonding area BA of the image sensor chip 200 may include the third area as well as the first and the second areas, and the third modified diffusion resistor 140 may be configured into such a structure that the summation of the first and the second areas may be in range of about 50% to about 70% of the surface area SA of the bonding surface 201 of the image sensor chip 200.

According to the above example embodiments of the image sensor package, the liquid diffusion of the bonding member may be restrained and limited between the image sensor chip and the circuit board by the diffusion resistor, so the bonding area and the bonding position of the image sensor may be uniform irrespective of individual bonding process. Thus, the image sensor chip may be stably and uniformly bonded to the circuit board irrespective of each bonding process and the warpage characteristics of the image sensor package may be improved due to the diffusion resistor on the circuit board. Particularly, since the bonding area and the bonding position of the image sensor chip with respect to the circuit board may have much effect on the warpage characteristics of the image sensor package, the bonding characteristics of the present image sensor package may greatly improve the warpage characteristics of the image sensor package.

Particularly, when the image sensor chip may move towards the circuit board for a bonding process, the image sensor chip may be arranged over the circuit board by using the diffusion resistor as a reference point in such way the central portion C of the image sensor chip face the diffusion resistor. Thus, the central portion of the image sensor chip may be bonded to the diffusion resistor of the circuit board, so that the bonding force between the image sensor chip and the circuit board may be symmetrical with respect to the central portion and may be uniform along a whole circuit board, thereby reducing or minimizing the warpage of the image sensor package.

While at least one example embodiment discloses that the image sensor chip may be bonded to the circuit board, any other chips would be bonded to the circuit board including the diffusion resistor. Thus, various semiconductor packages as well as the image sensor package may be manufactured under the same inventive concepts of the diffusion resistor. For example, an optical sensor chip, a touch sensor chip and various semiconductor chips may be bonded to the circuit board having the diffusion resistor. Otherwise, a microelectromechanical system (MEMS) chip may be bonded to the circuit board having the diffusion resistor.

CIS Module and Electronic System Having the CIS Module

Figure 5:
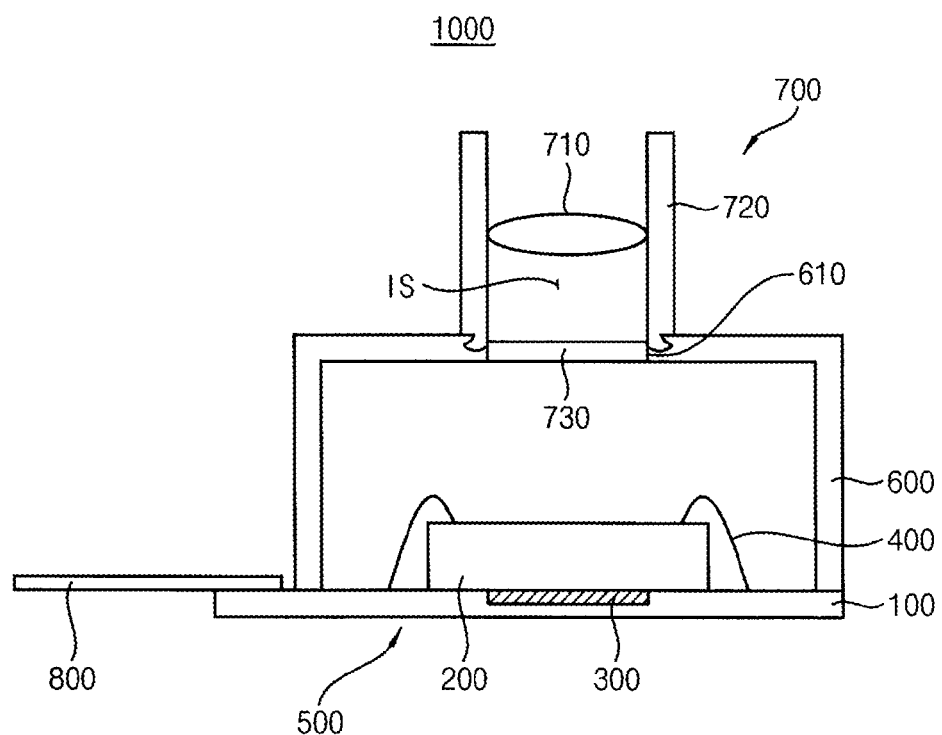
FIG. 5 is a structural view illustrating an image sensor module including the image sensor package shown in FIG. 1.

FIG. 5 is a structural view illustrating an image sensor module including the image sensor package shown in FIG. 1.

Referring to FIG. 5, the image sensor module 1000 in accordance with at least one example embodiment of the present inventive concepts may include an image sensor package 500 including a circuit board 100 and an image sensor chip 200 bonded to the circuit board 100 and generating image signals from optical signals, a housing 600 installed on the circuit board 100 to cover the image sensor chip 200 and having an opening 610 through the image sensor chip 200 may be partially exposed, and a lens unit 700 guiding the optical signals to the image sensor chip 200 through the opening 610.

The image sensor package 500 may have substantially the same structures and configurations as the image sensor package described in detail with reference to FIG. 1, thus the same reference numerals in FIG. 5 denote the same elements in FIG. 1.

Therefore, the image sensor package 500 may include the circuit board 100 having a diffusion resistor 110 for preventing liquid drop diffusion due to a compression to a liquid drop, the image sensor chip 200 mounted on the circuit board 100 in such a configuration that a central portion of the image sensor chip 200 may be positioned on the diffusion resistor 110 of the circuit board 100 and generating the image signals from the external optical signals, and a bonding member 300 interposed between the circuit board 100 and the image sensor chip 200 around the diffusion resistor 110 in such a configuration that a bonding area BA of the image sensor chip 200 is smaller than a surface area SA of a bonding face 201 of the image sensor chip 200. Therefore, the liquid diffusion of the bonding member 300 may be sufficiently controlled by the diffusion resistor 110 to have a proper bonding area and bonding position when the image sensor chip 200 may be bonded to the circuit board 100. Thus, the bonding area and the bonding position of the image sensor chip 200 with respect to the circuit board 100 may be uniform and constant irrespective of the individual bonding process and the bonding force may be uniformly distributed along the circuit board, thereby sufficiently improving warpage characteristics of the image sensor package 500.

The diffusion resistor 110 may be variously modified according to the process requirements of the image sensor package 500 just like the first to third modifications of the diffusion resistor 110. Since the image sensor package 500 may have the same configurations of the image sensor package described in detail with reference to FIG. 1, any further detailed descriptions on the image sensor package 500 will be omitted hereinafter.

The housing 600 may be arranged along a peripheral portion of the circuit board 100 in such a way that the image sensor chip 200 may be enclosed with the housing 600. Thus, the image sensor chip 200 may be protected from external surroundings by the housing 600. An opening 610 may be provided with the housing 600 and the external optical signal may reach the image sensor chip 200 through the opening 610. For example, the housing 600 may be formed into a preset shape by an injection molding process and may include epoxy resin, alkyd resin or silicone resin.

The lens unit 700 may guide the optical signals to the image sensor chip 200 through the opening 610. For example, the lens unit 700 may include at least one lens 710 positioned at an upper portion of the opening 610 and focusing external optical rays onto the image sensor chip 200, a barrel 720 for holding the lens 710 and an infrared filter 730 positioned at a lower portion of the barrel 720 and filtering infrared rays from the external optical lights.

The lens 710 may include a transparent member such as a glass through which external reflective lights reflected from a subject may be diverged or converged into an optical image. A group of the lenses 710 may be provided with lens unit 700 according to usage requirements of the image sensor module 1000.

The barrel 720 may be provided on the housing 600 in such a configuration that an inner space IS may be communicated with the opening 610 and the lens 710 may be arranged in the barrel 720. Thus, the reflective light may pass into the barrel 720 and may be focused into the optical image through the lens 710 in the barrel 720. Various lens holders (not shown) may be arranged in the barrel 720 for securing the lens 710 to the barrel 720 and a barrel fastener (not shown) may be provided for securing the barrel 720 to the housing 600.

The infrared filter 730 may be interposed between the lens 710 and the image sensor chip 200 and may filter infrared rays from the focused lights passing through the lens 710. Thus, the infrared-filtered optical signals may reach the image sensor chip 200 and the image sensor module 1000 may have improved color reproduction.

A contact terminal 800 may be provided with the circuit board 100 and the image signals may be transferred outwards from the image sensor chip 200. In addition, driving signals or various control signals may also be transferred to the image sensor chip 200 through the contact terminal 800.

While at least one example embodiment discloses that the circuit board 100 may function as a module board for the image sensor module 1000, an additional board would be provided as the module board. That is, the circuit board 100 of the image sensor package 500 may be combined to the additional module board and the housing 600 and the lens unit 700 may be installed to the module board. In such a case, an additional heat dissipater may be additionally provided with the module board and a supplementary chip for supporting the image sensor chip 200 may also be mounted on the module board, thereby increasing the operational quality of the image sensor module. For example, a cooling member for cooling the image sensor module may be provided at an inside of the module board and the image sensor package may be mounted at a lower portion of the module board in view of the thickness reduction of the image sensor module.

Figure 6:
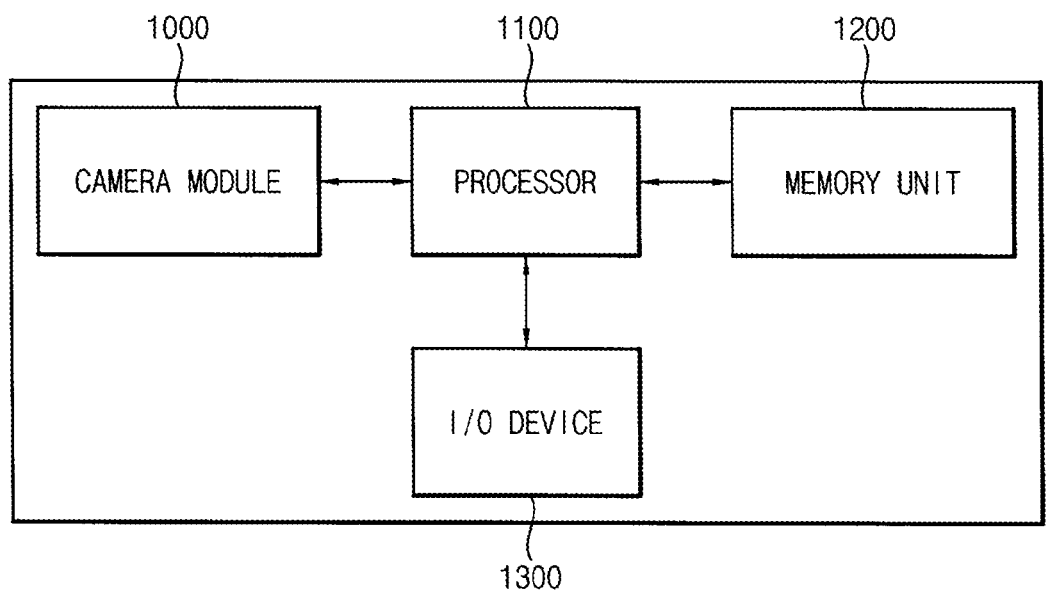
FIG. 6 is a block diagram showing an electronic system having the image sensor module shown in FIG. 5.

FIG. 6 is a block diagram showing an electronic system having the image sensor module shown in FIG. 5.

Referring to FIG. 6, an electronic system 2000 in accordance with at least one example embodiment of the present inventive concepts may include an image sensor module 1000 for generating image signals, an image processor 1100 for processing the image signals to thereby generate digital image data, a memory module 1200 communicating with the image processor 1100 and storing the image data, and input/output module 1300 communicating with the image processor 1100. For example, the electronic system 2000 may include a cellular phone, a digital camera, a digital video camera and a portable computer, etc.

The image sensor module 1000 may include substantially the same structures as the image sensor module described in detail with reference to FIG. 5. Although not shown in FIG. 6, the image signals generated from the image sensor module 1000 may be converted into the digital image signals by a signal conversion unit such as an analogue-digital converter (ADC) and the digital image signals may be transferred to the image processor 1100.

The digital image signals may undergo various signal processing procedures in the image processor 1100, to thereby generate the digital image data. Particularly, the image processor 1100 may further include a flash memory for temporarily storing the digital image signals and the digital image signals may standby in the flash memory for the signal processing procedure in the image processor 1100. The digital image data may be stored in the memory module 1200. The memory module 1200 may include various readable and writable memory systems. For example, the memory module may include a storage system having a plurality of flash memory devices.

The image data may be communicated with any other systems such as a personal computer and a server for a network system through the input/output module 1300. In addition, the image data generated from the image processor 1100 may be displayed on a display that may be connected to the input/output module 1300, or may be transferred to another computer system and a printer that may be connected to the input/output module 1300. The input/output module 1300 may be connected to a data transfer system such as a data bus line and a wireless antenna. The image sensor module 1000, the image processor 1100, the memory module 1200 and the input/output module 1300 may be systemized into a single imaging processing system by a central processing unit (CPU), thereby providing the electronic system 3000.

According to the above example embodiments of the present inventive concepts, the liquid diffusion of the bonding member may be restrained and limited between the image sensor chip and the circuit board by the diffusion resistor, so the bonding area and the bonding position of the image sensor may be uniform irrespective of individual bonding process. Thus, the image sensor chip may be stably and uniformly bonded to the circuit board irrespective of each bonding process and the warpage characteristics of the image sensor package may be improved due to the diffusion resistor on the circuit board. Particularly, since the bonding area and the bonding position of the image sensor chip with respect to the circuit board may have much effect on the warpage characteristics of the image sensor package, the bonding characteristics of the present image sensor package may greatly improve the warpage characteristics of the image sensor package. As a result, the operational stability and reliability may be improved in the electronic system including the image sensor module.

Particularly, when the image sensor chip may move towards the circuit board for a bonding process, the image sensor chip may be arranged over the circuit board by using the diffusion resistor as a reference point in such way the central portion C of the image sensor chip face the diffusion resistor. Thus, the central portion of the image sensor chip may be bonded to the diffusion resistor of the circuit board, so that the bonding force between the image sensor chip and the circuit board may be symmetrical with respect to the central portion and may be uniform along a whole circuit board, thereby reducing or minimizing the warpage of the image sensor package.

At least one example embodiment of the image sensor may be applied to various imaging apparatus and electronic systems including the image sensor package in which the liquid diffusion of the bonding member may be accurately controlled and the bonding area and bonding position of the image sensor chip may be uniform and stable. In addition, the inventive concepts of the diffusion resistor may also be applied to any other combinations in which two members may be bonded with each other.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An image sensor package comprising:
   a circuit board having a diffusion resistor for preventing liquid drop diffusion due to a compression to a liquid drop;
   an image sensor chip mounted on the circuit board such that a central portion of the image sensor chip is positioned on the diffusion resistor of the circuit board; and
   a bonding member interposed between the circuit board and the image sensor chip around the diffusion resistor such that a bonding area of the image sensor chip is smaller than a surface area of a bonding face of the image sensor chip,
   wherein the image sensor chip includes an active pixel sensor (APS) for generating signal electrons in response to external optical signals, a logic unit connected to the APS and processing of the APS corresponding to the signal electrons and a shield layer covering the logic unit and shielding electromagnetic waves.

2. The image sensor package of claim 1, wherein the diffusion resistor includes a protrusion portion protruding from a front surface of the circuit board to a protrusion height in such a configuration that the bonding member covers top and side portions of the protrusion portion.

3. The image sensor package of claim 2, further comprising an anti-deflection member filling a gap space between the circuit board and a peripheral portion of the image sensor chip, to thereby prevent a deflection of the image sensor chip toward the circuit board.

4. The image sensor package of claim 1, wherein the diffusion resistor includes a recess recessed from a front surface of the circuit board to a recess depth in such a configuration that the bonding member is positioned in the recess and on the front surface around the recess.

5. The image sensor package of claim 1, wherein the diffusion resistor includes an isolated portion defined by a trench on the front surface of the circuit board in such a configuration that the bonding member is positioned on the isolated portion and in the trench of the circuit board.

6. The image sensor package of claim 1, wherein the bonding member includes one of epoxy resin, acryl resin, polyimide resin and silicone resin.

7. The image sensor package of claim 6, further comprising at least one bonding wire connecting the image sensor chip and the circuit board.

8. The image sensor package of claim 1, wherein the APS and the logic unit include a plurality of complementary metal-oxide semiconductor (CMOS) devices.

9. The image sensor package of claim 1, wherein the circuit board include one of an organic substrate, a silicon substrate, a ceramic substrate and a glass-reinforced epoxy substrate.

10. The image sensor package of claim 1, wherein the bonding area is 50% to 70% of the surface area of the bonding face of the image sensor chip.

11. An image sensor module comprising:
    an image sensor package including a circuit board having a diffusion resistor for preventing liquid drop diffusion due to a compression to a liquid drop, an image sensor chip mounted on the circuit board in such a configuration that a central portion of the image sensor chip is positioned on the diffusion resistor of the circuit board and generating image signals from optical signals, and a bonding member interposed between the circuit board and the image sensor chip around the diffusion resistor in such a configuration that a bonding area of the image sensor chip is smaller than a surface area of a bonding face of the image sensor chip;

a housing installed on the circuit board to cover the image sensor chip and having an opening through the image sensor chip is partially exposed; and a lens unit guiding the optical signals to the image sensor chip through the opening, wherein the image sensor chip includes an active pixel sensor (APS) for generating signal electrons in response to external optical signals, a logic unit connected to the APS and processing of the APS corresponding to the signal electrons and a shield layer covering the logic unit and shielding electromagnetic waves.

12. The image sensor module of claim 11, wherein the bonding area is 50% to 70% of the surface area of the bonding face of the image sensor chip.

13. The image sensor module of claim 11, wherein the diffusion resistor includes one of a protrusion portion protruding from a front surface of the circuit board to a protrusion height, a recess recessed from a front surface of the circuit board to a recess depth and an isolated portion defined by a trench on the front surface of the circuit board.

14. The image sensor module of claim 11, wherein the image sensor chip includes a CMOS image sensor chip having at least one complementary metal-oxide semiconductor (CMOS) device.

15. An image sensor package comprising:

a circuit board having a diffusion resistor for preventing liquid drop diffusion due to a compression to a liquid drop;

an image sensor chip mounted on the circuit board such that a central portion of the image sensor chip is positioned on the diffusion resistor of the circuit board; and a bonding member interposed between the circuit board and the image sensor chip around the diffusion resistor such that a bonding area of the image sensor chip is smaller than a surface area of a bonding face of the image sensor chip, wherein the diffusion resistor includes a protrusion portion protruding from a front surface of the circuit board to a protrusion height in such a configuration that the bonding member covers top and side portions of the protrusion portion.

16. The image sensor package of claim 15, further comprising an anti-deflection member filling a gap space between the circuit board and a peripheral portion of the image sensor chip, to thereby prevent a deflection of the image sensor chip toward the circuit board.

* * * * *